United States Patent [19]

Fuse et al.

[11] Patent Number: 5,077,492

[45] Date of Patent: Dec. 31, 1991

[54] BICMOS CIRCUITRY HAVING A COMBINATION CMOS GATE AND A BIPOLAR TRANSISTOR

[75] Inventors: Tsuneaki Fuse; Satomi Nakano, both of Tokyo; Toshiki Seshita, Kawasaki; Koji Sakui, Tokyo, all of Japan

[73] Assignee: Kabushiki Kaisha Toshiba, Kawasaki, Japan

[21] Appl. No.: 440,670

[22] Filed: Nov. 24, 1989

[30] Foreign Application Priority Data

Dec. 13, 1988 [JP] Japan ............................ 63-314288

[51] Int. Cl.$^5$ ............................................ H03K 17/16
[52] U.S. Cl. .................................... 307/446; 307/570; 307/451; 307/454; 307/264
[58] Field of Search ............... 307/445, 446, 570, 576, 307/451, 454, 264

[56] References Cited

U.S. PATENT DOCUMENTS

| | | | |
|---|---|---|---|
| 4,616,146 | 10/1986 | Lee et al. | 307/454 |
| 4,740,713 | 4/1988 | Sakurai et al. | 307/451 |
| 4,767,950 | 8/1988 | Schrenk | 307/264 |
| 4,804,869 | 2/1989 | Masuda et al. | 307/570 |
| 4,806,797 | 2/1989 | Yamazaki | 307/446 |
| 4,808,850 | 2/1989 | Masuda et al. | 307/570 |

FOREIGN PATENT DOCUMENTS 3900232 12/1989 Fed. Rep. of Germany .

OTHER PUBLICATIONS

BiCMOS Circuitry: The Best of Both Worlds, IEEE Spectrum, vol. 26, No. 5, May 1989, pp. 50-53, Brian Santo.

Primary Examiner—Stanley D. Miller
Assistant Examiner—Scott A. Ouellette
Attorney, Agent, or Firm—Oblon, Spivak, McClelland, Maier & Neustadt

[57] ABSTRACT

A level shift element is contained in a through current path of a CMOS gate of a BiCMOS circuit. The level shift element limits an amplitude of an input signal to the BiCMOS circuit. The limited amplitude of the input signal controls the impact ionization within the CMOS gate, and the increase of a substrate current resulting from the impact ionization, and reduces the through current.

9 Claims, 19 Drawing Sheets

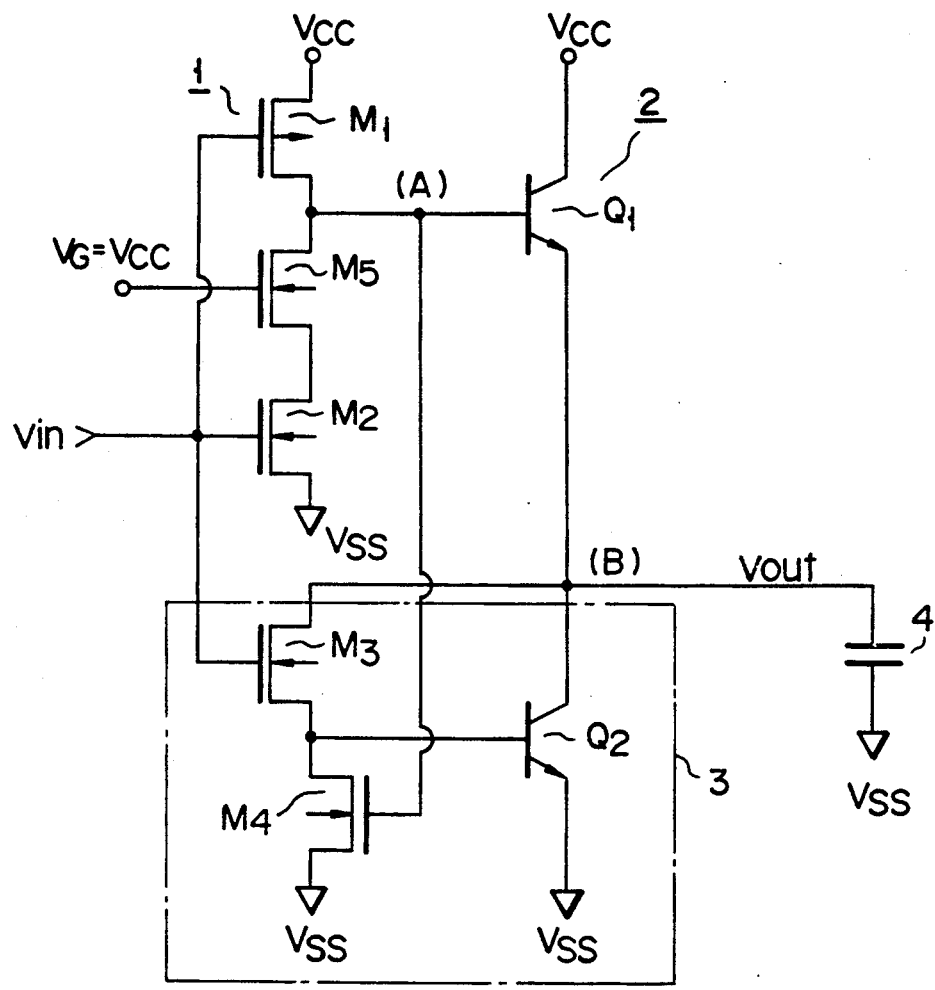
F I G. 1

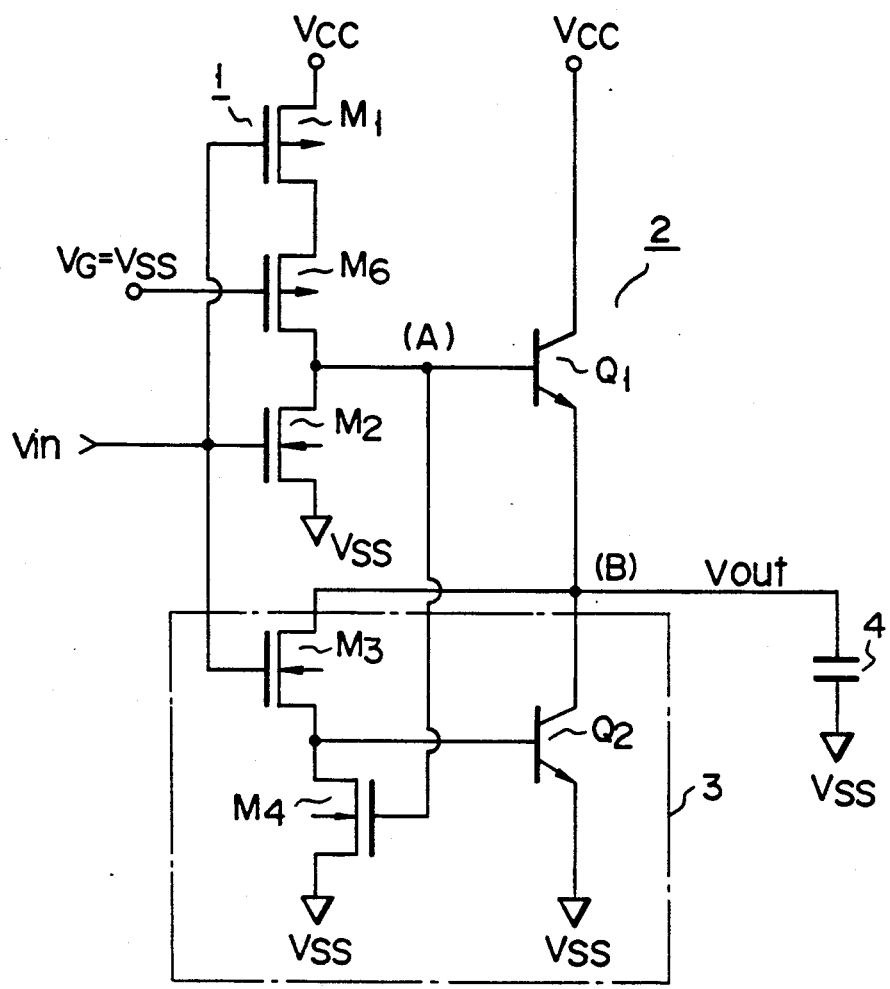
F I G. 2

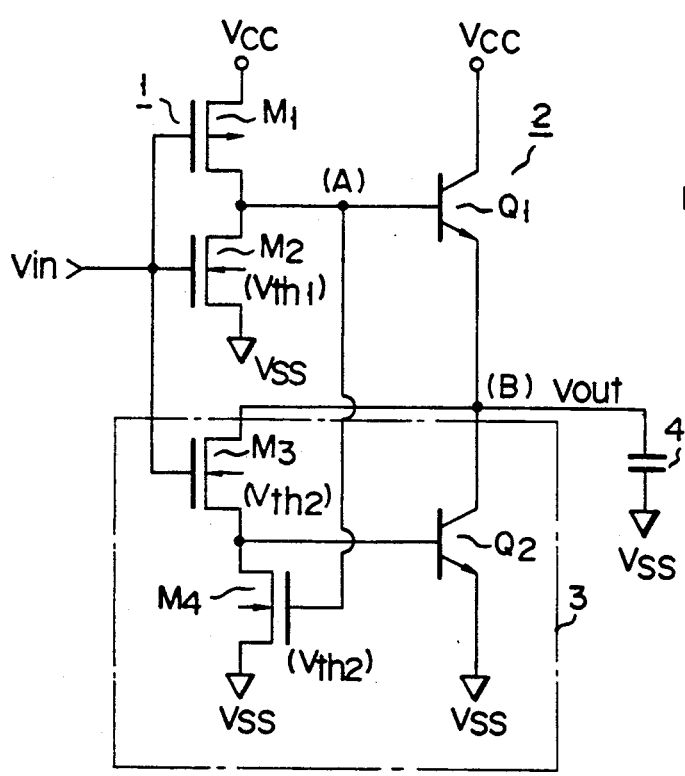
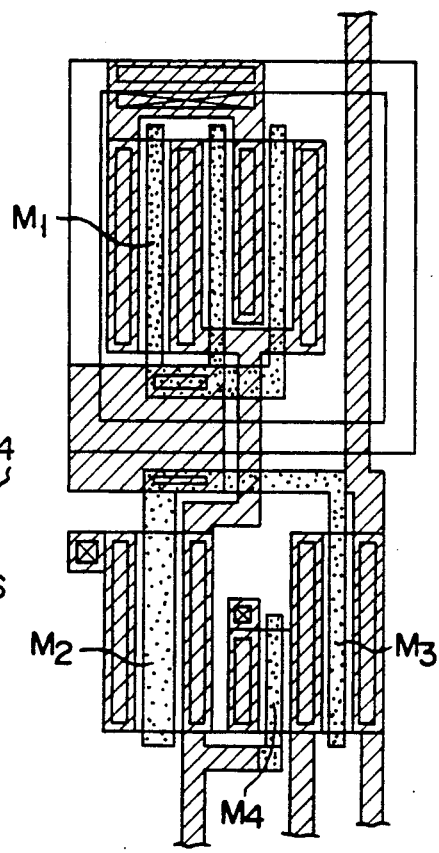
F I G. 3   F I G. 4

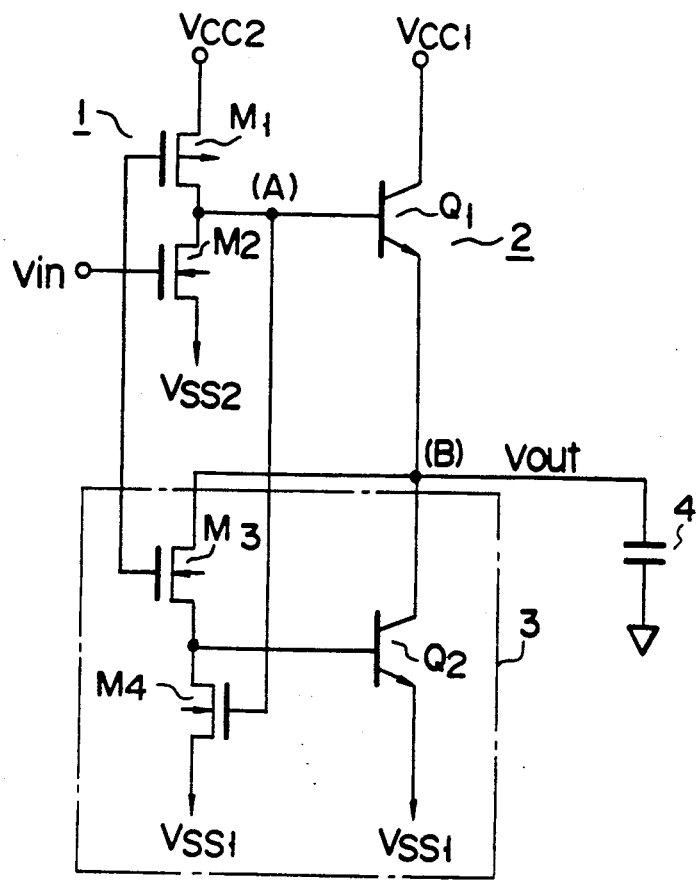
F I G. 5
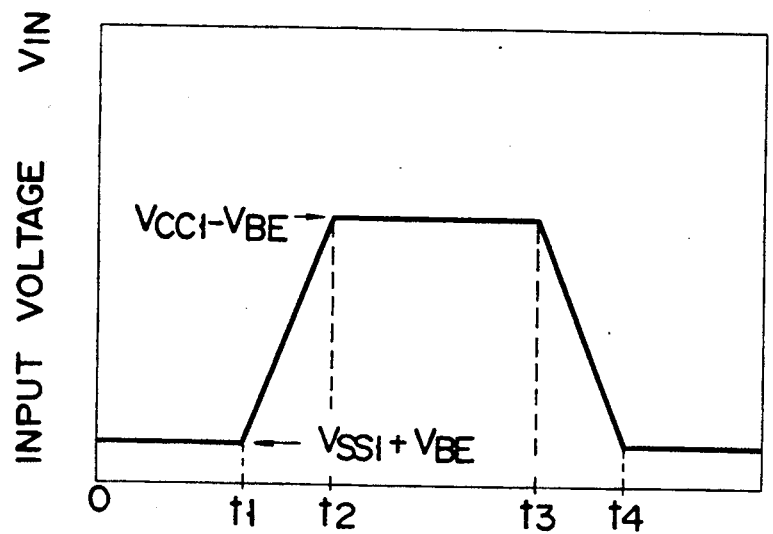
F I G. 6

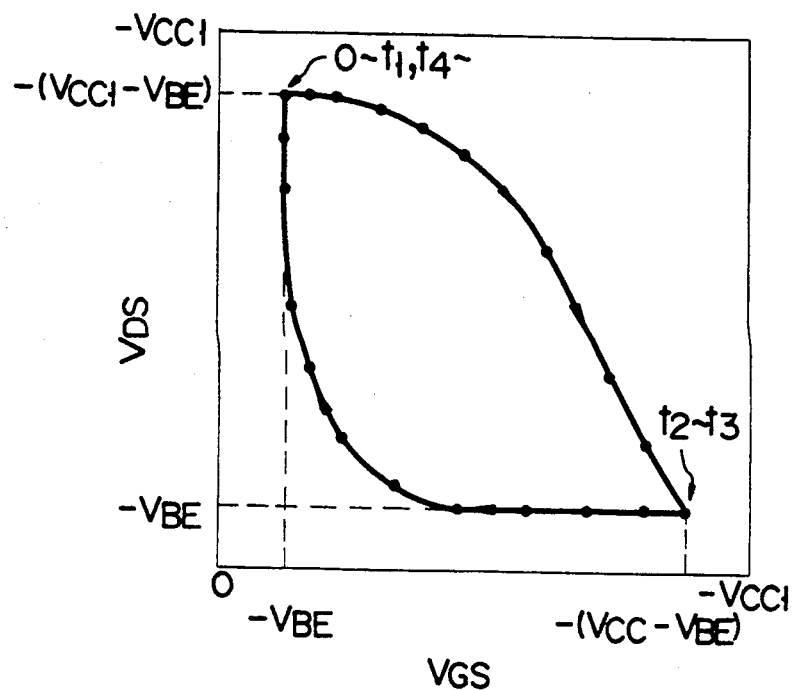
F I G. 8A
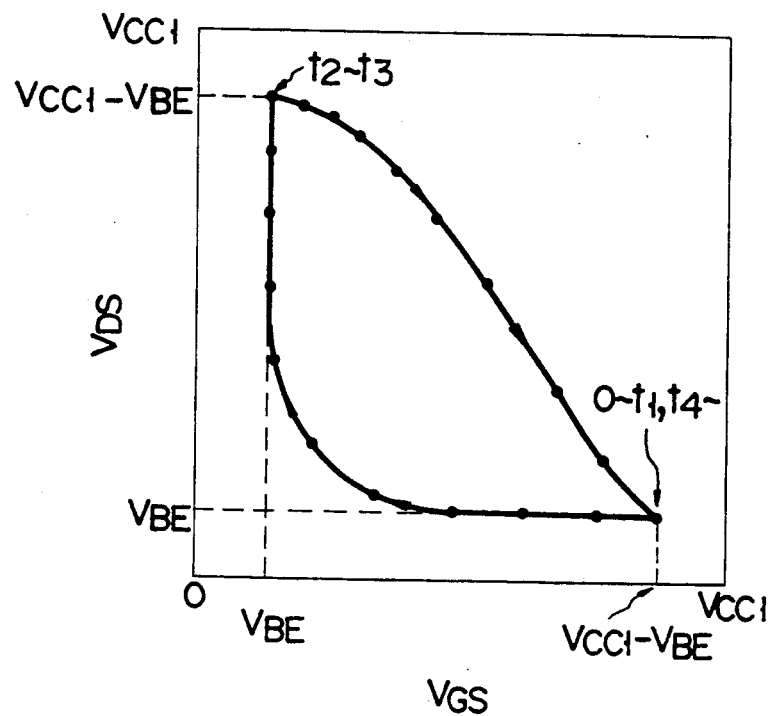
F I G. 8B

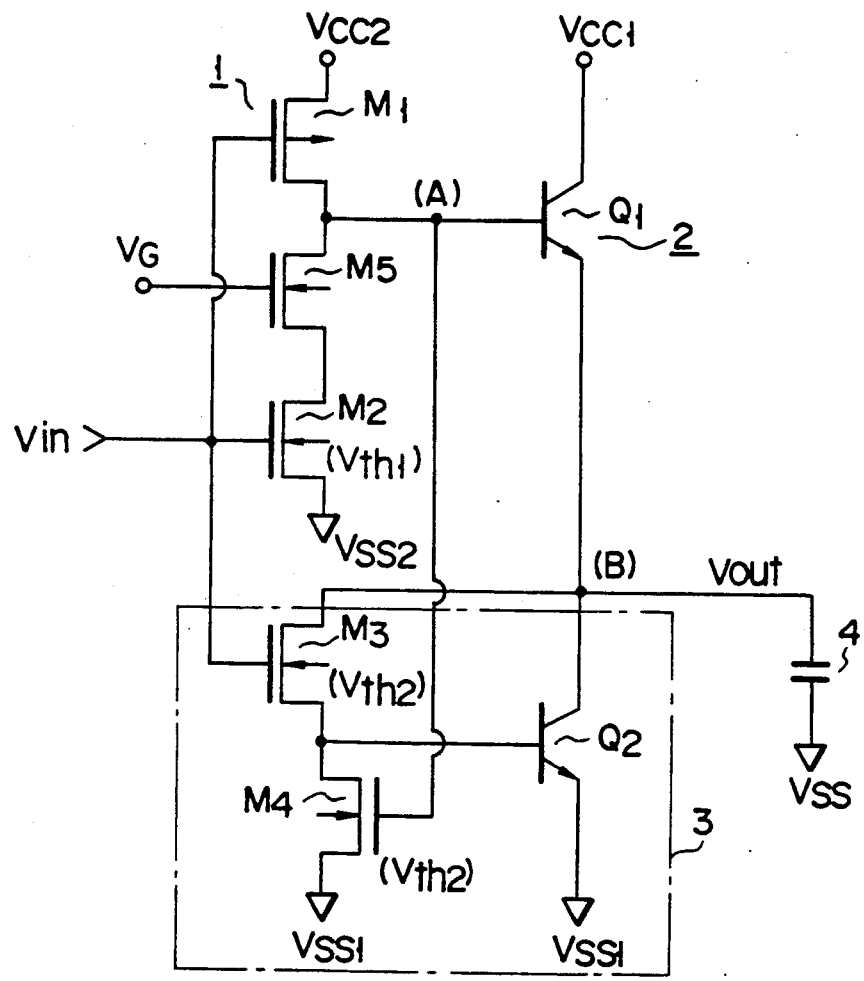
F I G. 9

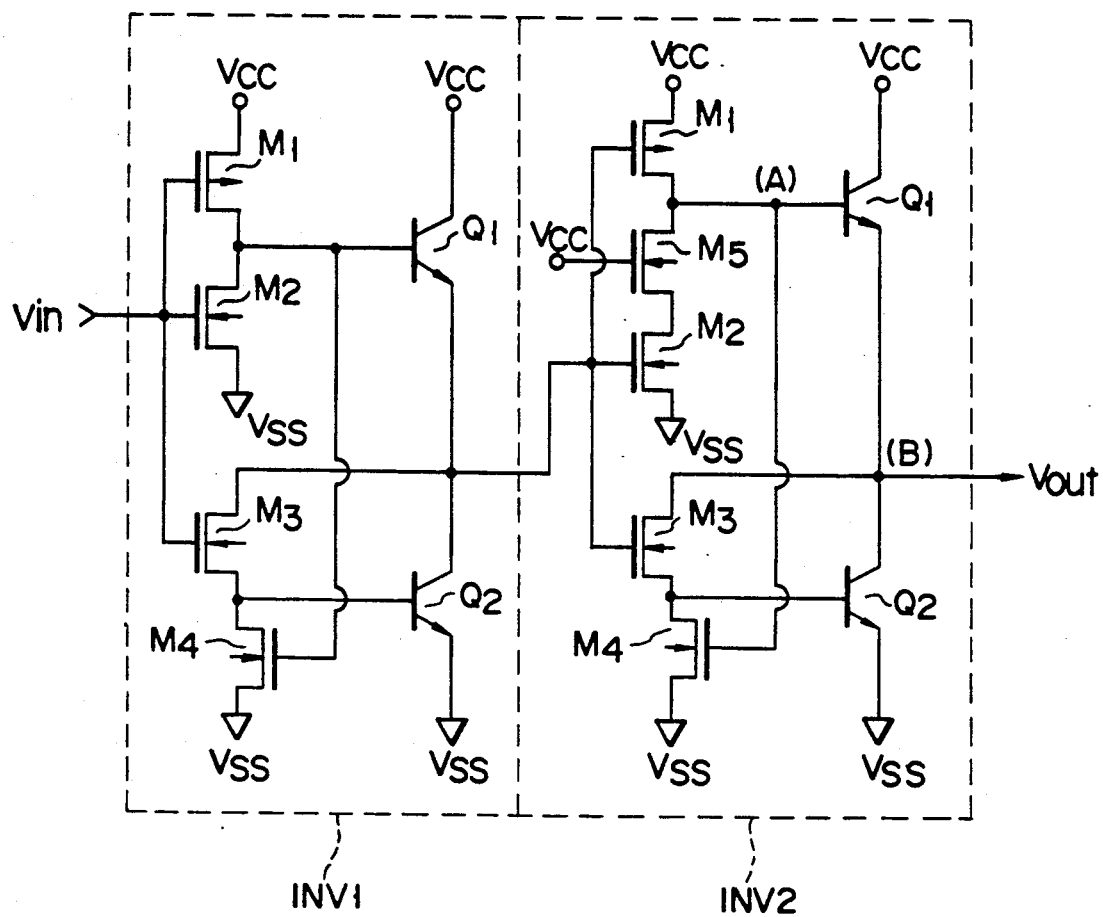
F I G. 10

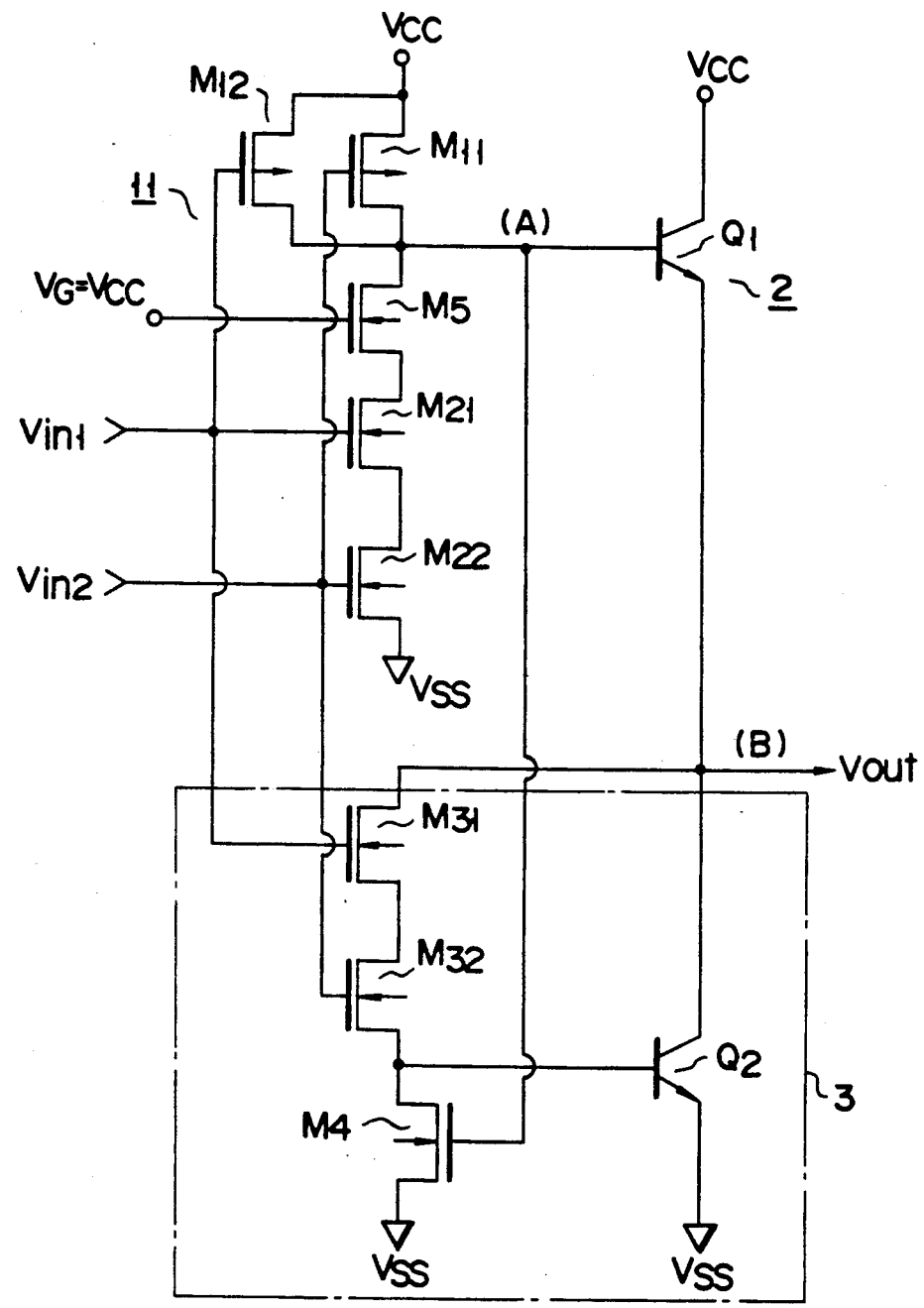
F I G. 11

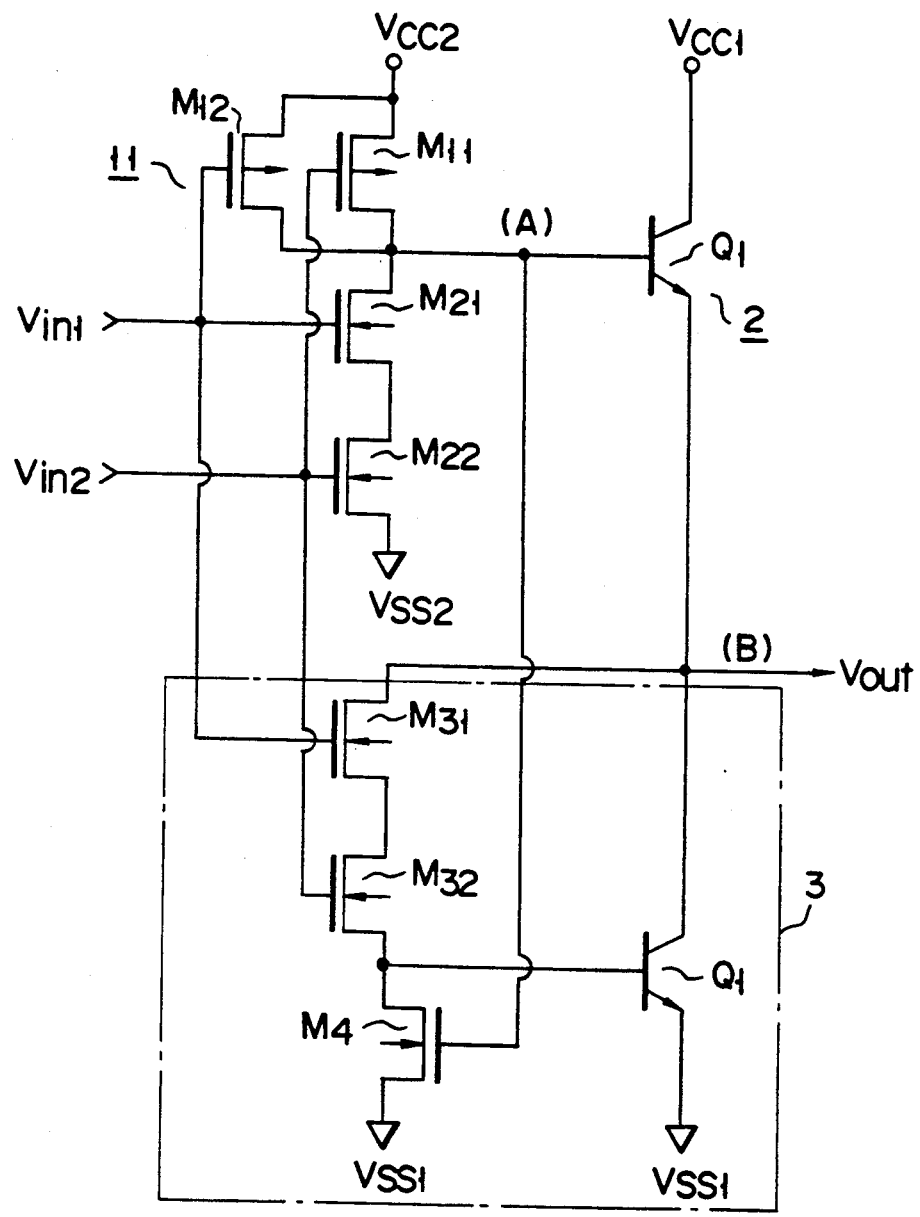
F I G. 13

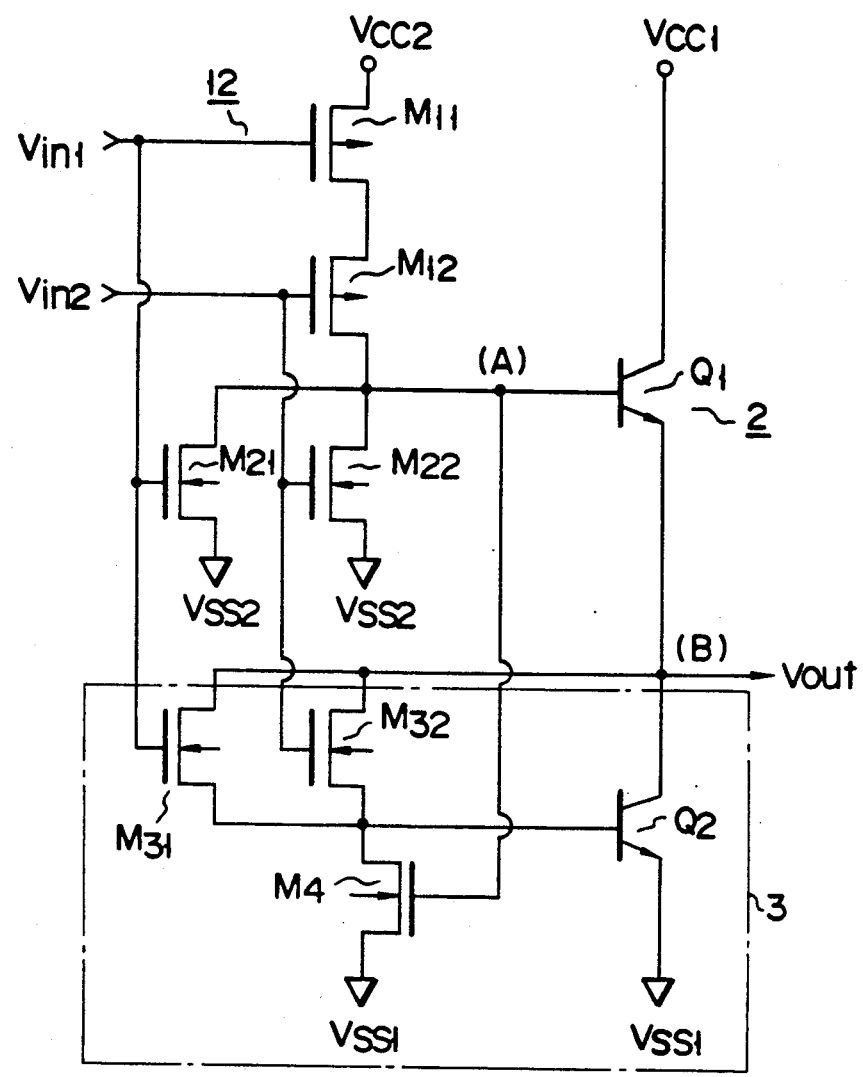
F I G. 14

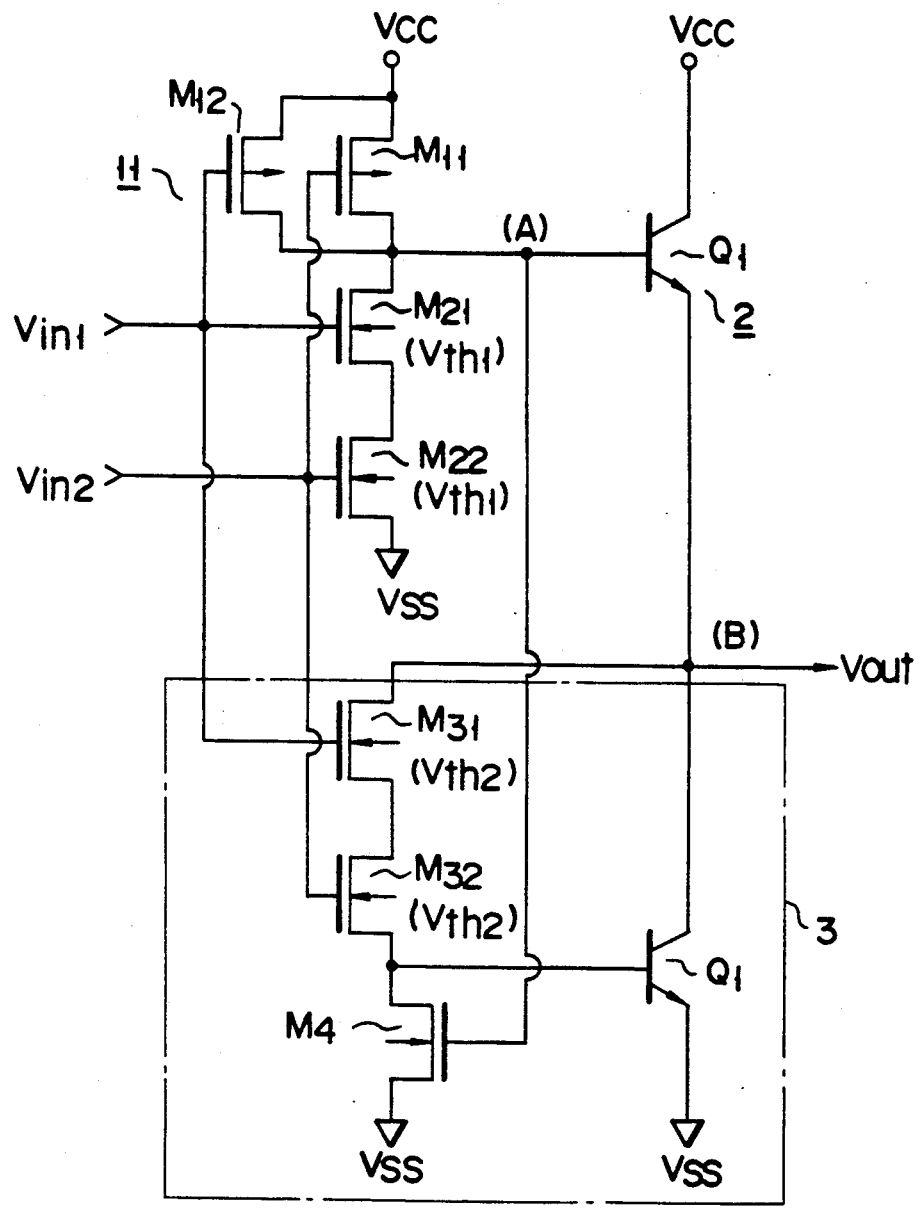
F I G. 15

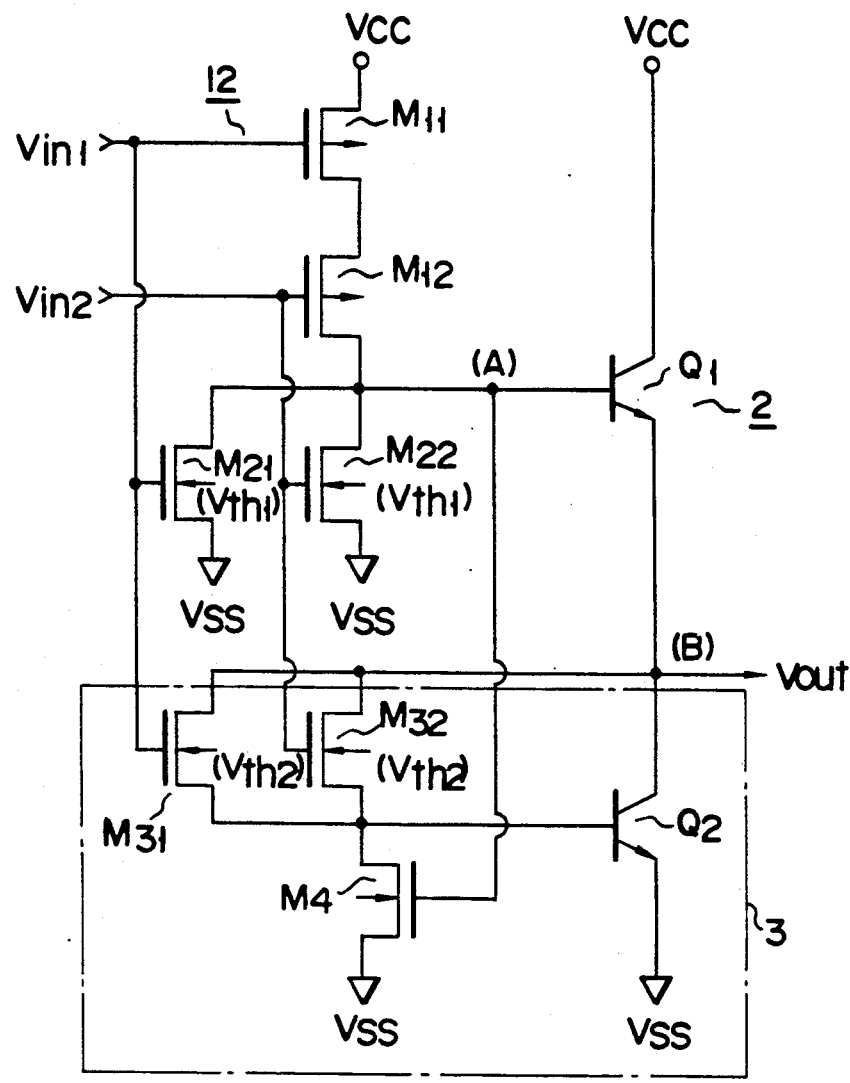
F I G. 16

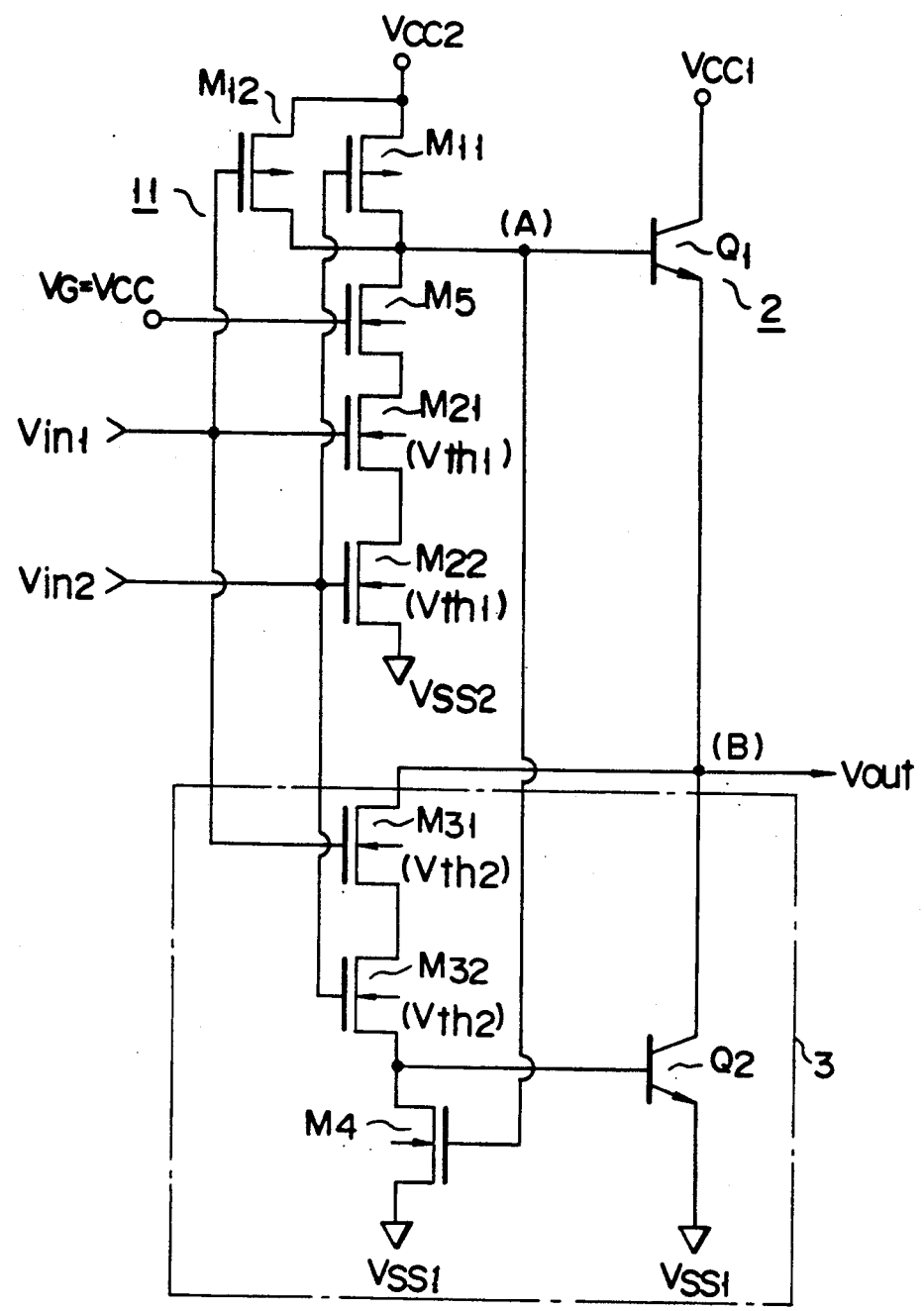
F I G. 17

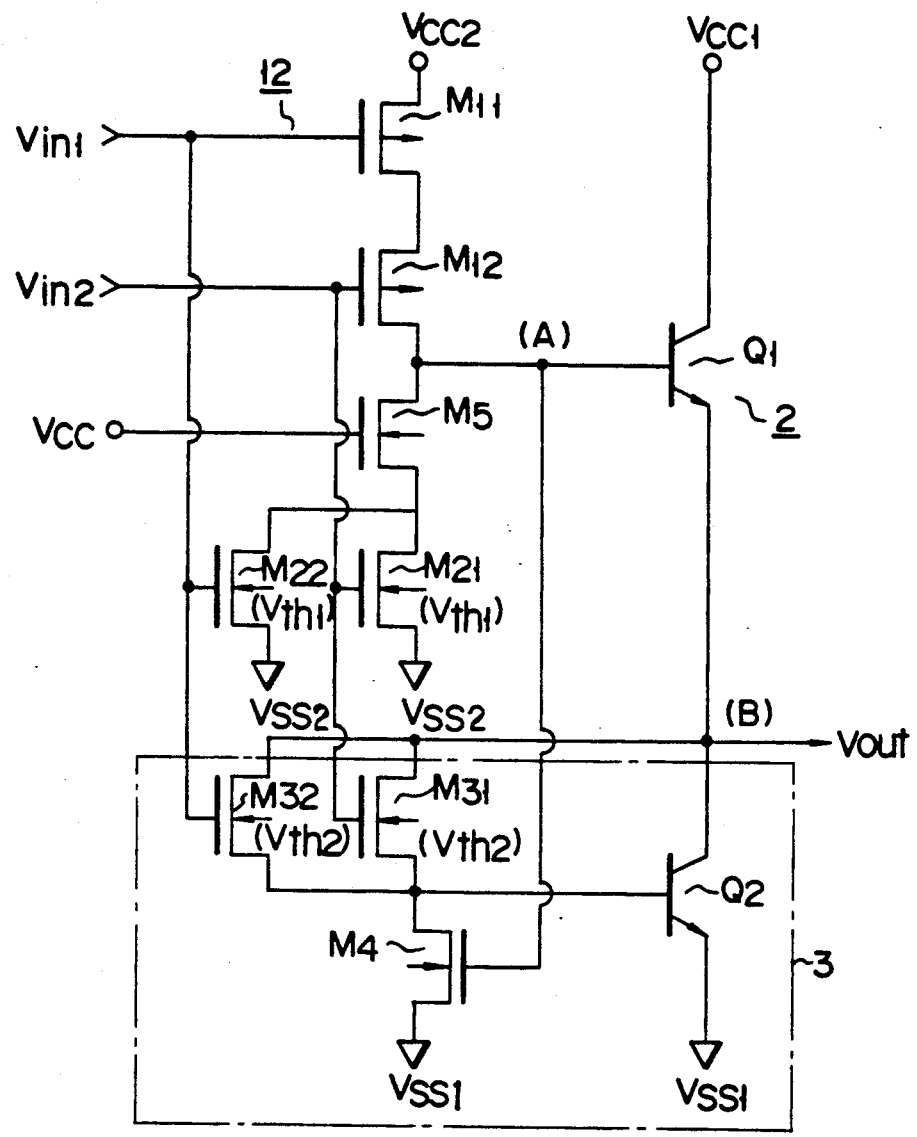
F I G. 18

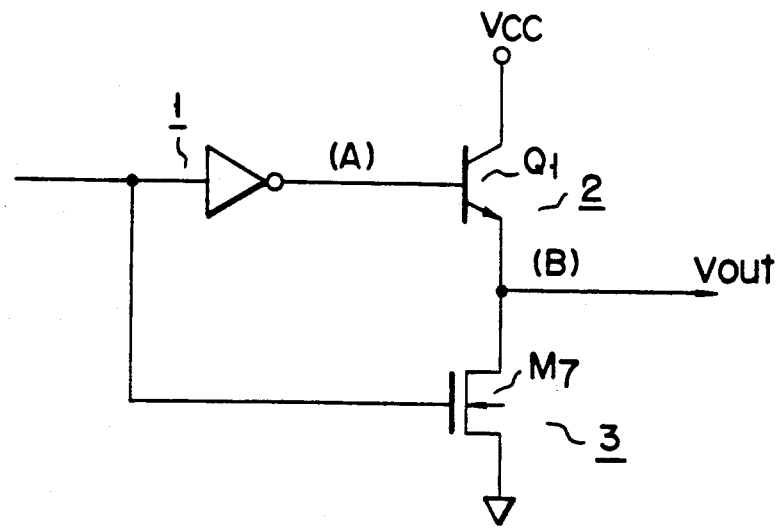
F I G. 19
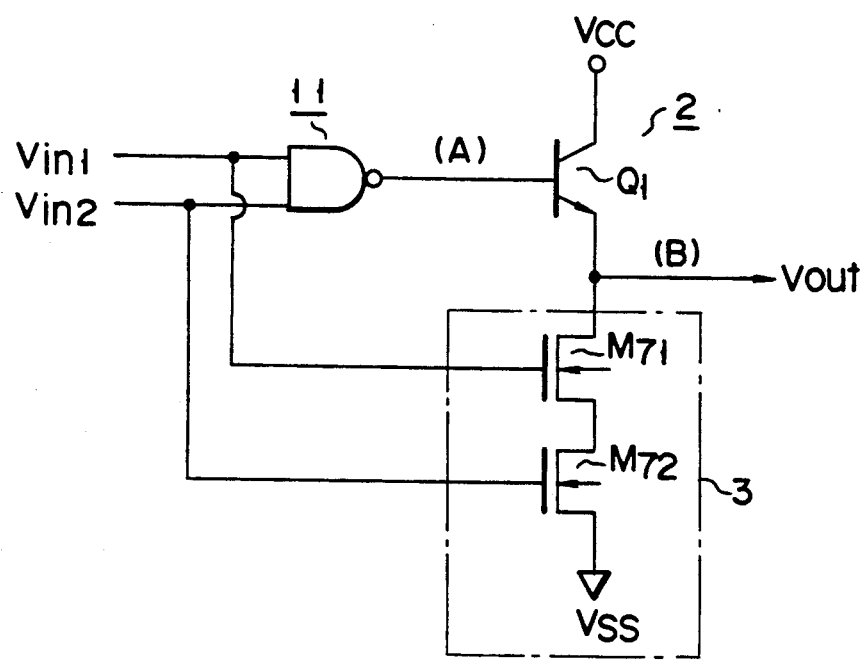
F I G. 20

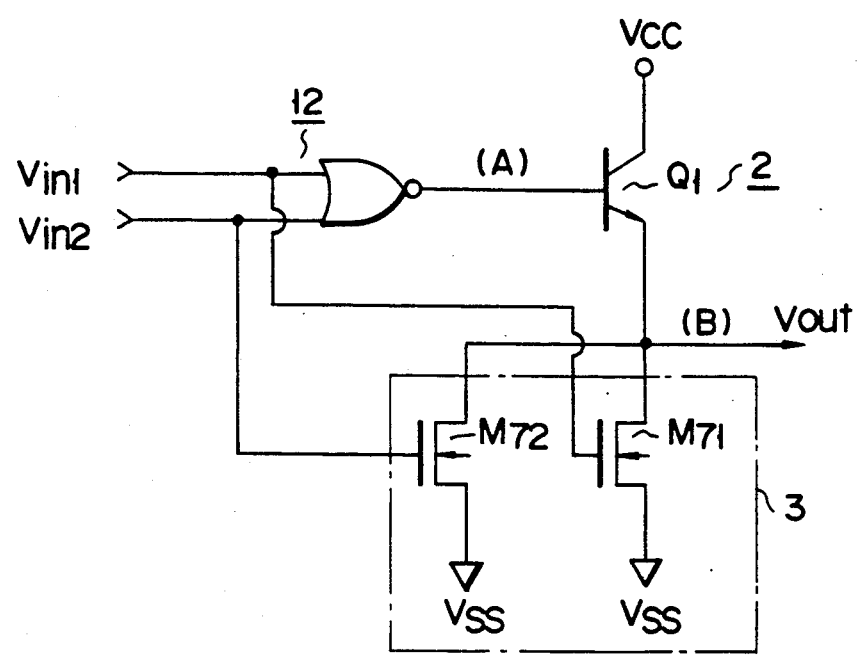
F I G. 21

BICMOS CIRCUITRY HAVING A COMBINATION CMOS GATE AND A BIPOLAR TRANSISTOR

BACKGROUND OF THE INVENTION

1. Field of the Invention

The present invention relates to a semiconductor integrated circuit, and more particularly to a BiCMOS circuit as a combination of a CMOS gate and a bipolar transistor.

2. Description of the Related Art

The BiCMOS circuit has two advantageous features; a low power dissipation as the feature of the CMOS circuit and a high drivability as the feature of the bipolar transistor. Because of these features, the BiCMOS circuits have been used in a variety of circuits, such as gate arrays, logic ICs, high speed SRAM and high speed DRAM.

FIG. 22 is a circuit diagram of a BiCMOS inverter, which is a basic arrangement of the BiCMOS circuit. As shown, the inverter is made up of a CMOS inverter 1, a charge circuit 2, and a discharge circuit 3. The charge circuit 2 is coupled between an output node of the inverter 1 and an output terminal B. The discharge circuit 3 allows the output node B to be discharged. The inverter 1 consists of a p-channel MOS transistor M1 and an n-channel MOS transistor M2, both transistors being interconnected at the drains. The charge circuit 2 consists of a first npn bipolar transistor Q1 whose collector is connected to a high potential source Vcc, base is connected to the output node A of the inverter 1, and emitter is connected to the output terminal B. The discharge circuit 3 consists of a second npn bipolar transistor Q2, and a couple of n-channel MOS transistors M3 and M4 for controlling the transistor Q2. The transistors Q1 and Q2 are connected in a totem pole fashion between the high potential source Vcc and a low potential source Vss. The source—drain path of the transistor M3 is connected between the output terminal B and the base of the transistor Q2. The transistor M3 receives at the gate an input signal Vin that is for the inverter 1, and operates under control of the signal Vin. In accordance with the input signal Vin, the transistor M3 forms a short-circuit between the collector and the base of the transistor Q2. In other words, the transistor M3 serves as an on-drive MOS transistor, which transfers a potential at the emitter of the first npn bipolar transistor Q1 to the base of the second npn bipolar transistor Q2, and turns on the transistor Q2. The source—drain path of the transistor M4 is connected between the base of the bipolar transistor Q2 and the source Vss of low potential. The transistor M4 receives at the gate a potential at the output node A of the CMOS inverter 1, and operates under control of that potential. In accordance with the output potential of the inverter 1, the transistor M4 provides a path through which charges at the base of the bipolar transistor Q2 flow to the source Vss. In this sense, the transistor M4 serves as an off-drive MOS transistor for turning off the transistor Q2.

The waveforms shown in FIG. 23 are useful in explaining the operation of the BiCMOS inverter. The waveforms were plotted under the condition that Vcc=5V, Vss=0V, and the input signal Vin was a clock signal of 5V in amplitude. When the input signal Vin is pulsed from a high of 5V to a low of 0V, the output node A of the CMOS inverter 1 is charged up to Vcc (=5V) through the MOS transistor M1. In turn, the bipolar transistor Q1 of the charge circuit 2 is turned on, the on-drive transistor M3 is turned off, and the off-drive transistor M4 is turned on. Under this condition, the base charge of the bipolar transistor Q2 is removed through the MOS transistor M4, turning off the transistor Q2. Consequently, the output signal Vout goes high.

When the input signal Vin goes high, the output node A goes low to turn off the transistor Q1. At this time, the transistor M3 is turned on, and the transistor M4 is turned off. Accordingly, the potential at the output terminal B is transferred to the base of the transistor Q2. The output signal Vout goes low.

In the BiCMOS inverter thus operating, the high level of the output signal Vout peaks at about 4.3V, below 5V of the Vcc, as shown in FIG. 23. The reason for this is that even where the base potential of the transistor Q1 is 5V, the transistor Q1 will turn off when the voltage between the base and the emitter of it is below the built-in voltage (VBE=0.7V). FIG. 23 also shows that the low level of the output signal Vout is not 0V but about 0.7V. The reason for this is that the transistor Q2 is turned on while it is diode connected, and the on-voltage is limited by the built-in voltage VBE between the base and the emitter of it.

As seen from the graph of FIG. 23, in the conventional BiCMOS inverter, when the input signal Vin of the full swing is applied, the high level and the low level of the output signal Vout do not go to the preset levels, respectively. In the BiCMOS inverters connected in a cascade fashion, the output signal of such levels adversely affects the operations of the second stage of the BiCMOS inverter and the succeeding ones. Firstly, a through-current flows in the CMOS inverter of the second stage of the BiCMOS inverter due to the nonuniformity in the threshold values of the MOS transistors used. Consider a circuit consisting of two stages of BiCMOS inverters. In the circuit, the threshold values (absolute values) of the n- and p-channel MOS transistors in the CMOS inverter are Vth and equal to each other. When Vth>VBE, the operation of the circuit is normal when the swing range of the output signal of the first stage inverter, i.e., the input signal of the second stage inverter, is VBE to Vcc - VBE. When Vth<VBE, both the p- and n- channel MOS transistors are always in an on state. Accordingly, a through-current flows in the CMOS inverter, resulting in an increase of a power dissipation in a standby mode. Secondly, an impact ionization occurs in the CMOS inverter in the second stage inverter. The reason why the impact ionization occurs is that when the input signal to the second stage inverter is in a low level, a high voltage is applied across the source—drain path of the n-channel MOS transistor before its turn-off is completed. When the input signal to the second stage inverter is in a high level, the impact ionization occurs in the p-channel MOS transistor for the same reason. The impact ionization possibly has adverse effects on the characteristics of the MOS transistors, such as change of the threshold values of the MOS transistors. Further, the impact ionization increases the substrate current. Accordingly, where a substrate bias generator circuit is mounted on the chip, the load to the bias generator circuit is large and its circuit design is intricate, if the impact ionization occurs.

The above problems exist not only in the BiCMOS inverter whose input stage consists of a CMOS inverter, but also in the BiCMOS inverter whose input stage uses a NAND gate or a NOR gate.

SUMMARY OF THE INVENTION

Accordingly, an object of the present invention is to provide a BiCMOS circuit which successfully controls an increase of the through-current in the CMOS gate due to the nonuniformity in the threshold values of the MOS transistors used, and hence reduces the power dissipation in the CMOS gate.

Another object of the present invention is to provide a BiCMOS circuit which successfully controls the characteristic degradation of the MOS transistors used and the increase of the substrate current based on the impact ionization.

According to one aspect of the present invention, a level shift element is placed in a through current path of a CMOS gate as the input stage of a BiCMOS circuit. With this feature, potential drops across the level shift element, and hence the voltage across the drain—source path of the MOS transistor being in an off state also drops in the CMOS gate. Accordingly, even if the amplitude of the output signal of the preceding BiCMOS stage is below the full swing amplitude, the impact ionization doesn't occur easily in the CMOS gate. Consequently, an increase of the substrate current is controlled. The through current in the CMOS gate, which arises from the limited amplitude of the output signal of the preceding BiCMOS, can be reduced by using an element having a current restriction function as the level shift element.

According to another aspect of the present invention, an absolute value of the threshold voltage of a MOS transistor in a CMOS gate as an input stage of a BiCMOS circuit is larger than that of other MOS transistors. This feature also makes it difficult for the impact ionization to occur in the CMOS gate. Accordingly, the reduction of the substrate current and the through-current is realized.

According to yet another aspect of the present invention, the potentials of the power sources used in the CMOS gate as the input stage of a BiCMOS circuit are set to be different from those of the power sources used in the output stage of the BiCMOS. This feature also impedes the impact ionization in the CMOS gate, and consequently reduces the substrate current and the through current.

BRIEF DESCRIPTION OF THE DRAWINGS

FIG. 1 is an equivalent circuit of a BiCMOS according to a first embodiment of the present invention;

FIG. 2 is an equivalent circuit of a BiCMOS according to a second embodiment of the present invention;

FIG. 3 is an equivalent circuit of a BiCMOS according to a third embodiment of the present invention;

FIG. 4 is a plan view showing a layout of a portion containing the MOS transistors M1 to M4 in the BiCMOS of FIG. 3 in which the channel length of the transistor M2 is longer than that of each of the remaining transistor;

FIG. 5 is an equivalent circuit of a BiCMOS according to a 4th embodiment of the present invention;

FIG. 6 is a diagram showing a waveform of an input voltage signal to the BiCMOS circuit of FIG. 5, which is useful in explaining the operation of the BiCMOS;

FIGS. 8A and 8B are graphs showing the sets of operating points of the transistors in a CMOS gate of a conventional BiCMOS circuit, which are plotted at fixed time intervals in a VDS - VGS plane when the input voltage signal of FIG. 6 is applied to the CMOS gate;

FIG. 9 is an equivalent circuit of a BiCMOS inverter according to a 5th embodiment of the present invention;

FIG. 10 is an equivalent circuit of cascade-connected BiCMOS inverters according to a 6th embodiment of the present invention;

FIG. 11 is an equivalent circuit of a BiCMOS NAND gate according to a 7th embodiment of the present invention;

FIG. 13 is an equivalent circuit of a BiCMOS NAND gate according to a 9th embodiment of the present invention;

FIG. 14 is an equivalent circuit of a BiCMOS NOR gate according to a 10th embodiment of the present invention;

FIG. 15 is an equivalent circuit of a BiCMOS NAND gate according to a 11th embodiment of the present invention;

FIG. 16 is an equivalent circuit of a BiCMOS NOR gate according to a 12th embodiment of the present invention;

FIG. 17 is an equivalent circuit of a BiCMOS NAND gate according to a 13th embodiment of the present invention;

FIG. 18 is an equivalent circuit of a BiCMOS NOR gate according to a 14th embodiment of the present invention;

FIG. 19 is an equivalent circuit of a BiCMOS inverter according to a 15th embodiment of the present invention;

FIG. 20 is an equivalent circuit of a BiCMOS NAND gate according to a 16th embodiment of the present invention;

FIG. 21 is an equivalent circuit of a BiCMOS NOR gate according to a 17th embodiment of the present invention;

DETAILED DESCRIPTION OF THE PREFERRED EMBODIMENT

Preferred embodiments of a BiCMOS circuit according to the present invention will be described with reference to the accompanying drawings.

Figure 22:
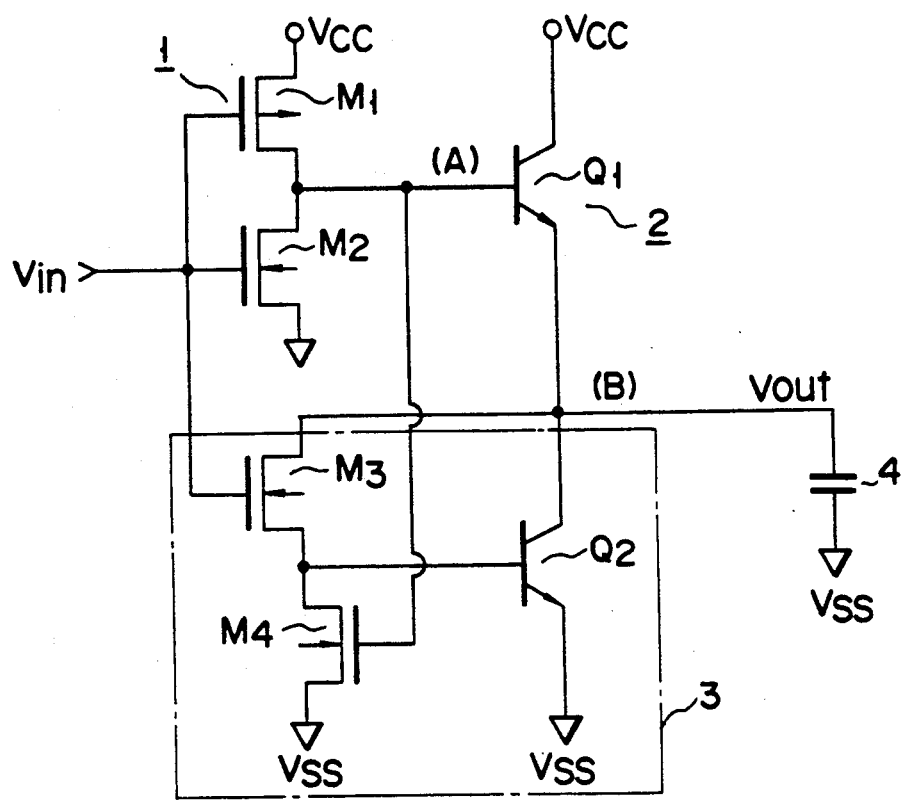
FIG. 22 is an equivalent circuit of a conventional BiCMOS inverter.
Figure 23:
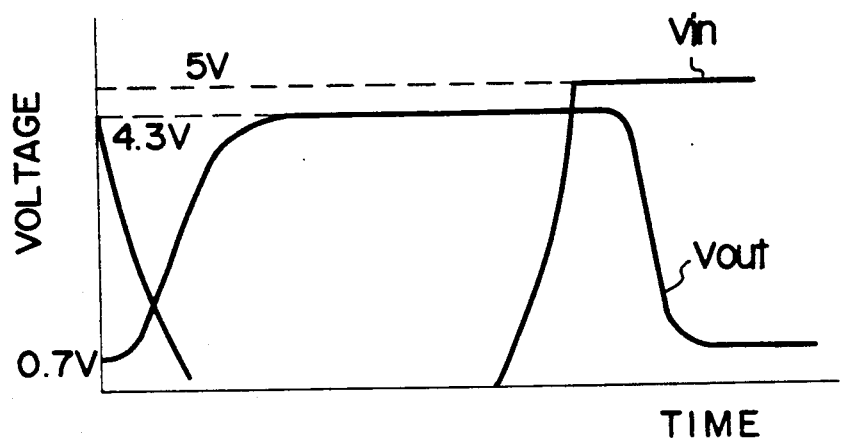
FIG. 23 shows waveforms for explaining the operation of the BiCMOS inverter shown in FIG. 22.

FIG. 1 shows a first embodiment of a BiCMOS according to the present invention. In the figure, like portions are designated by like symbols in FIG. 22, for simplicity. A CMOS inverter 1 includes a p-channel MOS transistor M1 coupled at the source with a high potential source Vcc, and an n-channel MOS transistor M2 coupled at the source with a lower or ground potential source Vss. A charge circuit 2, which is under control of the CMOS inverter 1, charges a load 4. The charge circuit 2 includes a first npn transistor Q1 as a charge transistor whose collector is connected to the high potential source Vcc, emitter is connected to an output terminal B, and base is connected to an output node A of the CMOS inverter 1. A discharge circuit 3, which is for discharging the load 4, consists of a second npn transistor Q2 as a discharge transistor, and a couple of n-channel MOS transistors M3 and M4 for controlling the discharge transistor Q2. The MOS transistor M3 serves as a on-drive transistor for turning on the discharge transistor Q2. The transistor M3 is an n-channel MOS transistor of the E type which is connected at the drain to the output terminal B, at the gate to the input terminal of the CMOS inverter 1, and at the source to the base of the second npn transistor Q2. The MOS transistor M4 serves as an off-drive MOS transistor which draws out the charges stored in the base of the discharge transistor Q2, to turn off the discharge transistor Q2. The MOS transistor M4 is an n-channel MOS transistor of the E type, which is connected at the drain to the base of the transistor Q2, at the source to the low potential source Vss, and at the gate to the output node A of the CMOS inverter 1. In the BiCMOS, inverter which is basically arranged as mentioned above, a n-channel MOS transistor M5 serving as a level shift element is additionally inserted between the MOS transistors M1 and M2 in the CMOS inverter 1. The level shift transistor M5 is located on the part of the transistor M2 with respect to the output node A of the CMOS inverter 1. A DC bias voltage VG is applied to the gate of the transistor M5. The bias voltage VG is set at a voltage capable of keeping the transistor M5 in an on state. The bias voltage VG is greater than the threshold voltage of the MOS transistor M5, e.g., VG=Vcc.

Basically, the operation of the BiCMOS circuit is that of the conventional BiCMOS circuit. Hence, no description of the basic operation will be given here. Let us consider a case that the input signal Vin is low in logic level, the MOS transistor M1 is in an on state, and the MOS transistor M2 is in an off state. In this case, if the level shift transistor M5 is not used, the high potential Vcc is transferred through the MOS transistor M1 to the drain of the MOS transistor M2. In this instance, however, because the level shift transistor M5 is present, the high potential appearing at the drain of the MOS transistor M2 is not the high potential Vcc, but VG - Vth5, where Vth5 is the threshold voltage of the transistor M5. If the drain potential of the transistor M2 exceeds the value VG - Vth5, the level shift transistor M5 is turned off. If VG=Vcc, the high level of the drain of the MOS transistor M2 is Vcc - Vth5. Thus, in this instance, the high potential, which is otherwise applied to the drain of the transistor M2, is limited by the level shift transistor M5. Accordingly, even if the potential of the low logic level of the input signal Vin is in approximation to or in excess of the threshold voltage of the MOS transistor M2, the impact ionization in the MOS transistor M2 is controlled. The potential of the high logic level of the output signal of the CMOS inverter 1 is not affected by the level shift transistor M5. Also when the input signal Vin goes high, and the output signal of the CMOS inverter 1 goes low, its output signal level is not affected by the level shift transistor M5.

Thus, the BiCMOS circuit of the instant embodiment may control the impact ionization in the MOS transistor M2 of the CMOS inverter 1 without any adverse effects on other characteristics. Accordingly, the substrate current is reduced and hence the power is also saved. Further, the current restriction by the channel resistance of the level shift transistor M5 reduces the through current in the CMOS inverter 1.

FIG. 2 is an equivalent circuit of a BiCMOS according to a second embodiment of the present invention. In the second embodiment, the level shift transistor M6 is a p-channel MOS transistor of the E type. The transistor M6 is located on the transistor M1 side with respect to the output node A of the CMOS inverter 1. The bias voltage VG applied to the MOS transistor M6 is the low potential or the ground potential Vss, for example.

Also in the second embodiment, the principle similar to that of the first embodiment works to control the impact ionization in the p-channel MOS transistor M1 of the CMOS inverter.

In the above two embodiments, the E type MOS transistor is used as the level shift element, but if necessary, it may be replaced by any of a resistive element, diode, D-type MOS transistor, and the like. Each of these latter elements is inferior to the E-type MOS transistor. However, it has the functions of the level shift and the current restriction, and the functions will ensure the advantageous effects in its way when it is assembled into the BiCMOS. Further, the combination of the circuit arrangements of FIGS. 1 and 2 may control the impact ionization in both the transistors M1 and M2 sides in the BiCMOS circuit 1.

FIG. 3 is an equivalent circuit of a BiCMOS according to a third embodiment of the present invention. The third embodiment is able to control the advantageous effect comparable with those by the above-mentioned embodiments, by using the prior circuit arrangement of FIG. 22. In the third embodiment, the threshold voltage Vth1 of the MOS transistor M2, and the threshold voltage Vth2 of the MOS transistors M3 and M4 are selected so as to satisfy the following relation, $$Vth1 > Vth2.$$

Feasible methods to satisfy the above relation are, for example, to set the gate length of the transistor M2 to be longer than that of the remaining transistors M3 and M4 or to set the channel impurity concentration of the transistor M2 to be higher than that of the transistors M3 and M4.

FIG. 4 is a plan view showing a layout of a portion containing the MOS transistors M1 to M4 in the BiCMOS of FIG. 3 in which the channel length of the transistor M2 is longer than that of the remaining transistors. In this instance, an SRAM of the design rule of 0.8 um is used, and the channel length of the MOS transistors M1, M3 and M4 is 0.8 um and that of the MOS transistor M2 is 1.2 um. With such geometrics, Vth1=0.9V and Vth2=0.7V.

Also this instance may control the impact ionization in the transistor M2 of the CMOS inverter 1. As known, as the threshold voltage is higher, it is more difficult for the impact ionization to occur in the transistor. Further, the higher the threshold voltage of the transistor M2 is, the smaller the through current of this transistor and the less an amount of the power dissipation is.

In the case that the impact ionization in the transistor M1 is controlled, the best way to effect the control is also to increase the absolute value of the threshold voltage of the transistor M1. If the threshold voltage of the MOS transistors M1 and M2 are selected to be larger in absolute value than that of the remaining transistors, the control of the impact ionization and the consequent reduction of the through current can more effectively be realized in the CMOS inverter 1.

FIG. 5 is an equivalent circuit of a BiCMOS according to a 4th embodiment of the present invention. The 4th embodiment is featured in that no level shift element is used and no alteration is applied to the element characteristics, but the values of the potential sources coupled with the active elements in the BiCMOS circuit are selected to be $$Vcc2 - Vss2 > Vcc1 - Vss1$$

where Vcc1 and Vss1 are high and low potential sources in the output circuit containing the first and second npn transistors Q1 and Q2, and Vcc2 and Vss2 are those in the CMOS inverter 1. In other words, in this instance, $Vcc1 \neq Vcc2$ and/or $Vss1 \neq Vss2$.

To be more exact, where the threshold voltage of the n-channel MOS transistor in the CMOS inverter 1 is Vth, the built-in potential between the base and the emitter of the transistor is VBE, and the smaller of Vth and VBE is V1, the following relation holds $$Vss1 < Vss2 \leq Vss1 + V1 \qquad (1)$$

This relation may also be realized by applying the potential Vss1 to the source of the transistor M2 in the CMOS inverter 1 through a level shift element capable of generating a potential drop less than the potential V1. The following relation holds between the high potentials Vcc1 and Vcc2

$$Vcc1 - VBE \leq Vcc2 < Vcc1 \qquad (2)$$

This relation may be realized also by applying the potential Vcc1 to the source of the transistor M1 in the CMOS inverter 1 through a level shift element.

As seen from the relation (1), by increasing the low potential Vss2 of the CMOS inverter 1, even when the potential of a low logic level of the input signal Vin is higher than the true potential, the gate - source voltage and the drain - source voltage of the transistor M2 may be set to be smaller than those of the conventional circuit, by increasing the low potential Vss2 of the CMOS inverter 1. This clearly shows that the impact ionization can be satisfactorily controlled. The result from increasing the low potential Vss2 is equivalent to that from increasing the threshold voltage of the transistor M2. Accordingly, the through current is reduced. As seen from the relation (2), decreasing the high potential Vcc2 below the potential Vcc1 controls the impact ionization in the transistor M1, and hence reduces the through current. The approach of the relation (2) reduces the potential of a high logic level of the output signal Vout of the BiCMOS circuit, however. For example, if $Vcc2 = Vcc1 - \Delta V$, the potential of a high logic level of the output signal of the BiCMOS circuit is $$Vout = Vcc1 - (VBE + \Delta V).$$

Accordingly, to prevent an improper operation of the circuit, the approach of the relation (2) is preferably applied to the final stage in a circuit consisting of the BiCMOS circuits cascade connected, because in the final stage, a reduction of the potential of the high logic level is allowed if it is within a predetermined range.

Turning now to FIG. 6, there is shown a waveform of an input voltage signal to the BiCMOS circuit of FIG. 5, which is useful in explaining the operation of the BiCMOS. The input signal Vin is an output signal Vout of the preceding stage of the BiCMOS inverter when some BiCMOS inverters are combined in series.

Figure 7A:
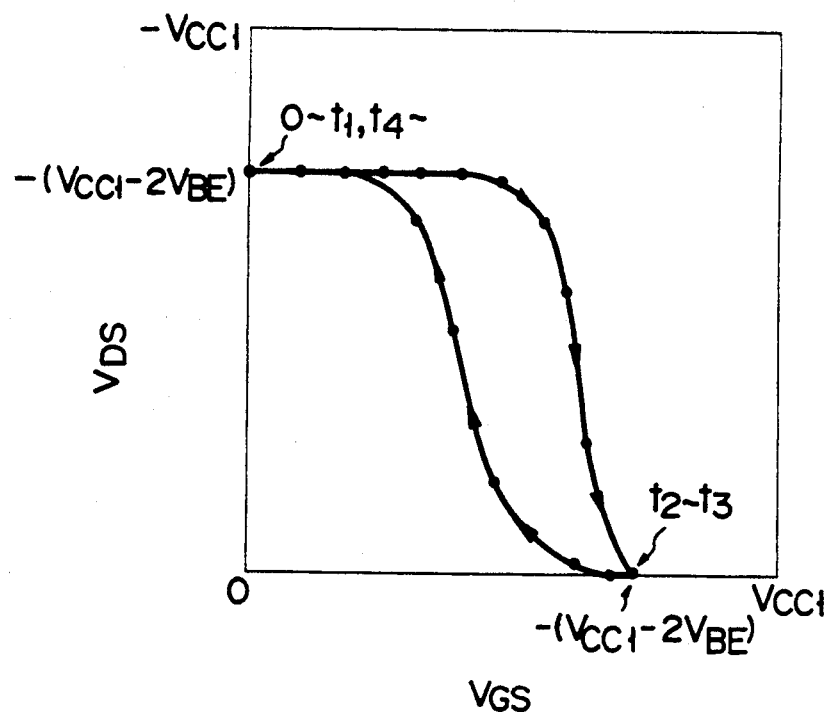
FIGS. 7A and 7B are graphs showing the sets of operating points of the transistors in a CMOS gate of the BiCMOS circuit of FIG. 5, which are plotted at fixed time intervals in a VDS - VGS plane when the input voltage signal of FIG. 6 is applied to the CMOS gate.
Figure 7B:
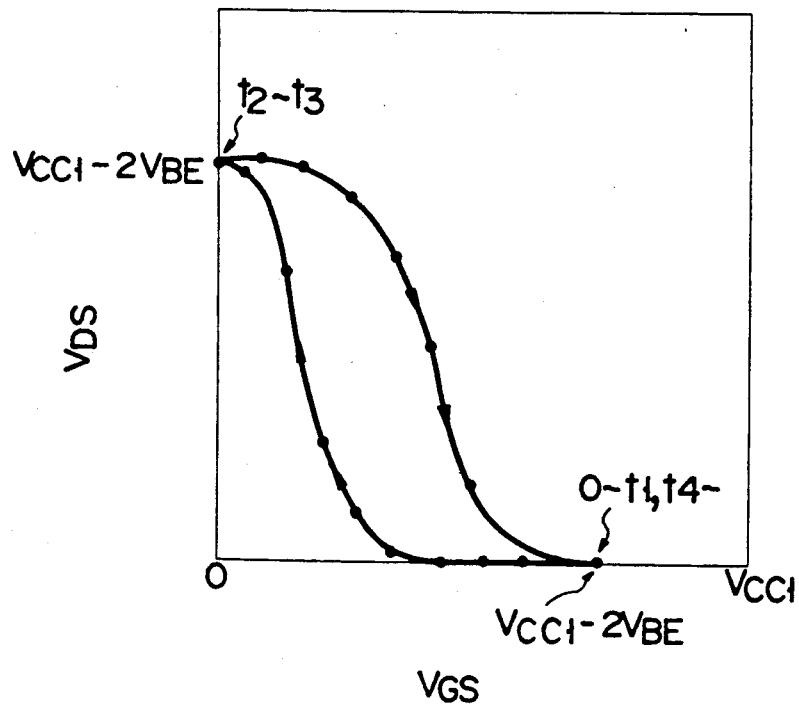

FIGS. 7A and 7B are graphs showing the sets of operating points of the p- and n-channel MOS transistors M1 and M2 in a CMOS gate 1 of the BiCMOS circuit of FIG. 5, which are plotted t fixed time intervals in a VDS - VGS plane when the input voltage signal of FIG. 6 is applied to the CMOS gate 1. The waveform shown in FIG. 7A and 7B was plotted under the condition that $Vss1 = 0$, $Vss2 = VBE$ and $Vcc2 = Vcc1 - VBE$. The graphs corresponding to those of FIGS. 7A and 7B of a conventional BiCMOS circuit are shown in FIGS. 8A and 8B. In the instant embodiment, when the input signal Vin is high in logic level, $VGS = 0$ in the p-channel MOS transistor M1. When it is low in logic level, $VGS = 0$ in the n-channel MOS transistor M2. Accordingly, neither the p-channel transistor or the n-channel transistor will suffer from the impact ionization. Even if the input signal Vin is at medium level between "H" and "L", the impact ionization and the through current in this embodiment are smaller than those in the conventional circuit, because the absolute values of VGS and VDS are smaller.

The above-mentioned embodiments are categorized into:

a) A level shift element is inserted between the p- and n-channel MOS transistors in the CMOS gate.

b) The threshold voltage of the MOS transistor or transistors in the CMOS gate is higher in absolute value than that of the remaining MOS transistors in the BiCMOS circuit.

c) The potentials of the high and low potential sources Vcc and Vss in the input stage or the CMOS inverter of the BiCMOS are selected separately from and different from those in the output circuit. It is evident that the present invention may be embodied by appropriate combinations of the embodiments a) to c). Some preferred combinations will be described hereinafter.

FIG. 9 is an equivalent circuit of a BiCMOS according to a 5th embodiment of the present invention. The 5th embodiment corresponds to the combination of the FIGS. 1, 3 and 5 embodiments. As shown, an n-channel MOS transistor M5 of the E type, which is continuously placed in an on state, is inserted between p- and n-channel MOS transistors M1 and M2 in a CMOS gate 1. The threshold voltage Vth1 of the MOS transistor M2 in the CMOS inverter 1 is set to be higher than the threshold voltage Vth2 of the MOS transistors M3 and M4 in a discharge circuit 3. The high and low potentials Vcc2 and Vss2 in the CMOS circuit 1 and those Vcc1 and Vss1 in the output circuit are selected according to the rule of the FIG. 5 embodiment. Accordingly, the control of the impact ionization, and the reduction of the substrate current and the through current can be attained.

In the above-mentioned embodiments, a single stage of the BiCMOS circuit has been described. As previously stated, the matter to which the present invention concerns is that when a plurality of BiCMOS circuits are cascade connected, an input voltage signal to the second and subsequent stages of BiCMOS circuits becomes small. Accordingly, it is suggestible that the approaches a) to c) above according to the present invention are applied to on the second and the subsequent stages of the BiCMOS circuits.

FIG. 10 is an equivalent circuit of a BiCMOS according to a 6th embodiment of the present invention. In the 6th embodiment, a couple of BiCMOS inverters INV1 and INV2 are connected in a cascade fashion. The circuit arrangement of the first stage of the BiCMOS inverter INV1 is the same as that of FIG. 22. The circuit arrangement of the stage of the BiCMOS inverter INV2 is the same as that of FIG. 1. With such a circuit arrangement, the problems due to the limited amplitude of the input signal Vin to the second BiCMOS inverter INV2 is successfully solved.

While in the above-mentioned embodiments the CMOS inverter is used for the CMOS gate, it is evident that the CMOS gate may be constructed with a CMOS NAND gate or a CMOS NOR gate, for example FIG. 11 is an equivalent circuit of a BiCMOS according to a 7th embodiment of the present invention. In they 7th embodiment, the CMOS gate 11 is constructed with a 2-input BiCMOS NAND gate. As shown, the NAND gate 11 is made up of a couple of n-channel MOS transistors M21 and M22 which are connected in series, and another couple of p-channel MOS transistors M11 and M12 which are connected in parallel. To turn on the second npn transistor Q2 as the discharge transistor, a couple of MOS transistors M31 and M32 are used whose gates are coupled for reception with the two input signals Vin1 and Vin2. An n-channel MOS transistor M5 of the E type as a level shift element is connected between the MOS transistors M11 and M21 in the NAND gate 1. The level shift transistor M5 is coupled at the gate with the potential VG = Vcc and is kept in an on state.

In the BiCMOS circuit thus arranged, when either of the two input signals Vin1 and Vin2 is low in logic level the output node A of the NAND gate 11 is high in logic level and the first npn transistor Q1 as the charge transistor is turned on. At this time, the discharge transistor Q2 is turned off. Consequently, the output signal Vout goes high When the two input signals Vin1 and Vin2 are both high, the output node A goes low, to turn off the charge transistor Q1. At this time, the two on-drive transistors Q31 and Q32 are both turned on. As a consequence, the output signal Vout goes low.

Also in this instance, the high level potential applied to the MOS transistors M21 and M22 connected in series is limited to the potential VG - Vth. Therefore, the impact ionization is controlled, the substrate current is reduced, and the through current is reduced.

Figure 12:
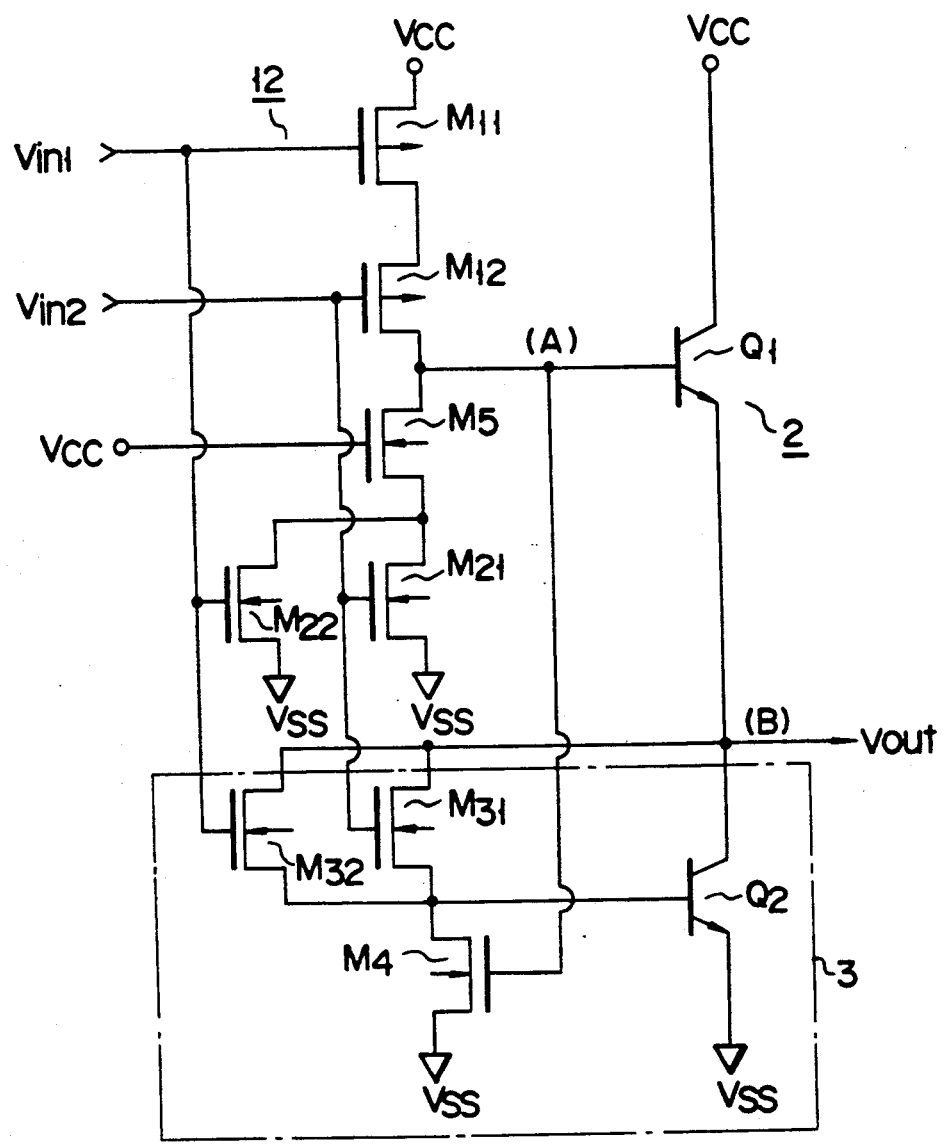
FIG. 12 is an equivalent circuit of a BiCMOS NOR gate according to a 8th embodiment of the present invention.

FIG. 12 is an equivalent circuit of a BiCMOS according to a 8th embodiment of the present invention In the 8th embodiment, the CMOS gate 1 is constructed with a 2-input BiCMOS NOR gate. As shown, the NOR gate 12 is made up of a couple of n-channel MOS transistors M21 and M22 which are connected in parallel, and another couple of p-channel MOS transistors M11 and M12 which are connected in series. To turn on the second npn. transistor Q2, a couple of MOS transistors M31 and M32. which are coupled in parallel, are used whose gates are coupled for reception with the two input signals Vin1 and Vin2. An n-channel MOS transistor M5 of the E type as a level shift element is connected between the output node A of the NOR gate 12 and the MOS transistors M21 and M22 in the NOR gate 12. The level shift transistor M5 is coupled at the gate with the potential Vcc and is kept in an on state.

Description of the operation of this instance is omitted for simplicity. The instant embodiment can also attain the advantageous effects comparable with those by the 7th embodiment using the NAND gate.

FIGS. 13 and 14 are respectively equivalent circuits of BiCMOS circuits according to 9th and 10th embodiments of the present invention. These embodiments use a 2-input BiCMOS NAND gate and a 2-input BiCMOS NOR gate respectively for the CMOS gates 11 and 12. In those gates, one of the high and low potentials Vcc2 and Vss2 is selected to be different from the corresponding one of those potentials Vcc1 and Vss1 in the output circuit. The same effects as those by the BiCMOS circuit using the CMOS inverter can be attained.

FIGS. 15 and 16 are respectively equivalent circuits of BiCMOS circuits according to 11th and 12th embodiments of the present invention. These embodiments use a 2-input BiCMOS NAND gate and a 2-input BiCMOS NOR gate respectively for the CMOS gates 11 and 12. In those embodiments, the threshold voltage Vth1 of the MOS transistors M21 and M22 in the gates 11 and 12 is selected to be higher than the threshold voltage Vth2 of the MOS transistors M31 and M32 in the discharge circuit 3.

FIG. 17 is an equivalent circuit of a BiCMOS according to a 13th embodiment of the present invention. In the 13th embodiment, a 2-input BiCMOS NAND gate 11 is used for the CMOS gate. The features of the FIGS. 11, 13 and 15 embodiments are incorporated into this embodiment.

FIG. 18 is an equivalent circuit of a BiCMOS according to a 14th embodiment of the present invention. In the 14th embodiment, a 2-input BiCMOS NOR gate 12 is used for the CMOS gate. The features of the FIGS. 12, 14 and 16 embodiments are incorporated into this embodiment.

While the bipolar transistors are used in the discharge circuit 3 in the above-mentioned embodiments, the discharge circuit may be constructed with MOS transistors.

FIG. 19 is an equivalent circuit of a BiCMOS according to a 15th embodiment of the present invention. The circuit arrangement shown corresponds to the circuit arrangement of each of the embodiments of FIGS. 1 through 3, 5 and 9, when an n-channel MOS transistor M7 is used in place of the bipolar discharge transistor Q2 in the discharge circuit 3. The MOS transistor M7 is connected at the drain to the output terminal B, at the source to the low potential source Vss, and at the gate to the input signal. Also in this embodiment, the bipolar transistor Q1 as the charge transistor and the MOS transistor M7 are complementally operated, as in the embodiments as mentioned above.

FIG. 20 is an equivalent circuit of a BiCMOS according to a 16th embodiment of the present invention. The circuit arrangement of the 16th embodiment corresponds to that of each of the embodiments of FIGS. 11, 13, 15 and 17 in which the CMOS gate consists of the BiCMOS NAND gate, when the discharge circuit 3 is constructed with a couple of n-channel MOS transistors M71 and M72 connected in series. The gates of the MOS transistors M71 and M72 are coupled for reception with the input signals Vin1 and Vin2. Also in this embodiment, the charge bipolar transistor Q1 and the series circuit of the MOS transistors H71 and M72 in the discharge circuit 3 are alternately operated.

FIG. 21 is an equivalent circuit of a BiCMOS according to a 17th embodiment of the present invention. The circuit arrangement of the 16th embodiment corresponds to that of each of the embodiments of FIGS. 12, 14, 16 and 18 in which the CMOS gate consists of the BiCMOS NOR gate, when the discharge circuit 3 is constructed with a couple of n-channel MOS transistors M71 and M72 connected in parallel. The gates of the MOS transistors M71 and M72 are coupled for reception with the input signals Vin1 and Vin2. Also in this embodiment, the charge bipolar transistor Q1 and the series circuit of the MOS transistors M71 and M72 in the discharge circuit 3 are alternately operated.

In the present invention, an N-input BiCMOS gate is available for the CMOS gate 11 or 12, in addition to the 2-input BiCMOS gate.

As seen from the foregoing description, the BiCMOS circuit according to the present invention can effectively control the impact ionization in the BiCMOS gate due to the limited amplitude of the input signal. Accordingly, the substrate current is controlled, providing a reliable BiCMOS circuit. The through current also is reduced in the CMOS gate, leading to power saving.

What is claimed is:

1. A BiCMOS circuit comprising:
   a CMOS gate circuit having an input terminal and a first n-channel MOS transistor having a threshold voltage Vth1;
   an npn transistor for charging a load whose collector is connected to a high potential source, base is connected to an output node of said CMOS gate circuit, and emitter is connected to an output terminal leading to said load;
   an npn transistor for discharging said load whose collector is connected to said output terminal, and emitter is connected to a low potential source;
   a second n-channel MOS transistor having a threshold voltage Vth2 provided between said output terminal and the base of said discharge npn transistor, the gate of said second n-channel MOS transistor being coupled for reception with said input terminal; and
   a third n-channel MOS transistor having a threshold voltage Vth2 provided between the base of said discharge npn transistor and said low potential source, the gate of said second n-channel MOS transistor being coupled for reception with said output node of said CMOS gate;
   wherein the threshold voltage Vth1 of said first MOS transistor is higher than that Vth2 of said second and third MOS transistors.

2. The BiCMOS circuit according to claim 1, wherein said CMOS gate circuit is an inverter.

3. The BiCMOS circuit according to claim 1, wherein said CMOS gate circuit is a NOR gate.

4. The BiCMOS circuit according to claim 1, wherein said CMOS gate circuit is a NAND gate.

5. A BiCMOS circuit comprising:
   a CMOS gate circuit having an input terminal, and a p-channel MOS transistor and an n-channel MOS transistor which are connected in series between a first high potential source and a first low potential first source,
   an npn transistor for charging a load whose collector is connected to a second high potential source, base is connected to an output node of said CMOS gate circuit, and emitter is connected to an output terminal leading to said load; and
   discharge means provided between said output terminal and a second low potential source, said discharge means discharging said load when said output node is low in logical level;
   wherein the following relation holds $$Vcc2 - Vss2 > Vcc1 - Vss1,$$

where Vcc2 and Vcc1 are said first and second high potential sources respectively, and Vss2 and Vss1 are said first and second low potential sources.

6. The BiCMOS circuit according to claim 5, wherein said discharge means includes an npn transistor for discharging said load whose collector is connected to said output terminal and emitter is connected to said second low potential source, an on-drive means for turning on said discharging npn transistor in accordance with a signal at said input terminal, said on-drive means being connected between said output terminal and the base of said discharging npn transistor, and an off-drive means for turning off said discharging npn transistor in accordance with a potential at said output node of said CMOS gate circuit, said off-drive means being connected between the base of said discharging npn transistor and said second low potential source.

7. The BiCMOS circuit according to claim 5, wherein said CMOS gate circuit is an inverter.

8. The BiCMOS circuit according to claim 5, wherein said CMOS gate circuit is a NOR gate.

9. The BiCMOS circuit according to claim 5, wherein said CMOS gate circuit is a NAND gate.

* * * * *